US006528894B1

(12) United States Patent
Akram et al.

(10) Patent No.: US 6,528,894 B1
(45) Date of Patent: Mar. 4, 2003

(54) USE OF NITRIDES FOR FLIP-CHIP ENCAPSULATION

(75) Inventors: Salman Akram, Boise, ID (US); Warren M. Farnworth, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/138,038

(22) Filed: Aug. 20, 1998

Related U.S. Application Data

(62) Division of application No. 08/717,273, filed on Sep. 20, 1996, now Pat. No. 5,956,605.

(51) Int. Cl.[7] .................. H01L 23/29; H01L 23/48; H01L 23/52; H01L 29/40
(52) U.S. Cl. ................ 257/788; 257/778; 438/613; 438/791
(58) Field of Search ............. 257/778; 438/613, 438/791

(56) References Cited

U.S. PATENT DOCUMENTS

| | | | |
|---|---|---|---|
| 3,716,907 A | 2/1973 | Anderson | |
| 3,767,394 A | 10/1973 | Akiyama | |
| 3,978,578 A | 9/1976 | Murphy | |
| 5,046,161 A | 9/1991 | Takada | |
| 5,084,752 A | 1/1992 | Satoh et al. | |
| 5,136,364 A | 8/1992 | Byrne | |
| 5,217,597 A | 6/1993 | Moore et al. | |
| 5,349,240 A | * 9/1994 | Narita et al. | 257/791 |
| 5,406,122 A | 4/1995 | Wong et al. | |
| 5,481,135 A | 1/1996 | Chandra et al. | |
| 5,547,906 A | 8/1996 | Badehi | |
| 5,599,749 A | 2/1997 | Hattori | |
| 5,600,180 A | 2/1997 | Kusaka et al. | |
| 5,641,113 A | 6/1997 | Somaki et al. | |
| 5,726,501 A | 3/1998 | Matsubara | |
| 5,825,078 A | * 10/1998 | Michael | 257/632 |
| 5,956,605 A | * 9/1999 | Akram et al. | 438/613 |
| 6,124,633 A | * 9/2000 | Vindasius et al. | 257/685 |
| 6,208,025 B1 | * 3/2001 | Bellaar et al. | 257/696 |

FOREIGN PATENT DOCUMENTS

| | | |
|---|---|---|
| JP | 05-121616 | 5/1983 |
| JP | 61-030059 | 2/1989 |
| JP | 62-136049 | 6/1989 |
| JP | 2-142134 | 6/1990 |
| JP | 2-234447 | 8/1990 |
| JP | 04-258125 | 9/1992 |

OTHER PUBLICATIONS

Gates, L.E., "Sealed Chip–on–Board", *Electronic Packaging & Production*, pp. 48–50, Sep. 1994.

* cited by examiner

*Primary Examiner*—Olik Chaudhuri
*Assistant Examiner*—Howard Weiss
(74) *Attorney, Agent, or Firm*—TraskBritt

(57) ABSTRACT

A hermetically sealed semiconductor flip chip and its method of manufacture is disclosed. The semiconductor flip chip of the present invention is sealed with a silicon nitride layer on an active surface of the flip chip. The silicon nitride layer covers the chip active surface, including bond pads and conductive connectors such as solder balls formed over the bond pads to effect electrical and mechanical connection to terminal pads of a carrier substrate. A portion of the silicon nitride layer is penetrated or removed to expose a portion of each conductive connector. The flip chip is then attached to a substrate by contact of the exposed portions of the conductive connectors with the terminal pads of the substrate. Also included in the invention is the alternative of sealing the flip chip, substrate and intervening connectors with a silicon nitride layer after the attachment of the flip chip to the substrate.

28 Claims, 4 Drawing Sheets

USE OF NITRIDES FOR FLIP-CHIP ENCAPSULATION

Cross Reference to Related Application

This application is a divisional of copending application Ser. No. 08/717,273, filed Sep. 20, 1996, now U.S. Pat. No. 5,956,605 issued Sep. 21, 1999.

BACKGROUND OF THE INVENTION

1. Field of the Invention

The present invention relates to hermetically sealed semiconductor chips. More particularly, the present invention relates to coating at least the active surface of a flip chip with a silicon nitride sealing layer.

2. State of the Art

Chip On Board ("COB") techniques are used to attach semiconductor dice to a printed circuit board, including flip chip attachment, wirebonding, and tape automated bonding ("TAB"). A flip chip is a semiconductor chip or die that has a pattern or array of spaced terminals or pads on its active surface for face-down mounting of the chip to a printed circuit board or other conductor-carrying substrate. Generally, the flip chip active surface carries one of the following types of electrical connector elements: Ball Grid Array ("BGA")—wherein an array of minute solder balls (sometimes called C4 connections, for controlled-collapse-chip-connect) or other conductive material is disposed on the surface of a flip chip that attaches to the substrate trace terminals or connecting pads ("the attachment surface"); or a Slightly Larger than Integrated Circuit Carrier ("SLICC")—which is similar to a BGA, but having a smaller solder ball/conductive material pitch and diameter than a BGA. With the BGA or SLICC, the solder or other conductive ball or element arrangement on the flip chip must be a mirror image of the connecting pads on the printed circuit board so that precise connection is made. When solder balls are employed, the flip chip is bonded (electrically and mechanically connected) to the printed circuit board by reflowing the solder balls. Other conductive elements such as conductive epoxies or conductor-filled epoxies or other polymers may be employed in lieu of solder balls and heat-cured after chip attachment.

Semiconductor chips must be able to withstand a wide variety of environmental conditions such as moisture, ion bombardment, heat and abrasion. A significant amount of work has been directed toward various protective measures to minimize the exposure of semiconductor chips to these environmental conditions in order to increase their reliability and operating life.

Many prior art processes for protecting semiconductor chips have involved sealing or encapsulating the chips after they have been attached to their respective lead frame, printed circuit board, or other carrier substrate. Plastic encapsulation of semiconductor chips is currently the most common form of packaging chips. Plastic encapsulation normally consists of encasing a leadframe-mounted semiconductor die in plastic under pressure in a transfer molding process. Furthermore, so-called "glob top" (commonly silicones and epoxies) and underfill (commonly epoxies) materials have been used to protect chips secured on a printed circuit board (such as an FR-4 glass-epoxy board), or ceramic or silicon substrate. A non-conductive polymer underfill is generally disposed between the active surface of a "flipped" semiconductor chip and the printed circuit board or other carrier substrate for environmental protection and to enhance the mechanical attachment of the semiconductor die to the substrate. An overfill encapsulant of viscous liquid or gelled silicone or epoxy (glob top) is sometimes applied over an entire assembly after COB attachment. In short, it is known in the art to use layers of silicones, polyimides, epoxies, plastics, and the like for protection of the COB assemblies.

While transfer-molded plastic encapsulation and glob tops are effective methods of protecting the semiconductor die from abrasion and some mechanical damage, such approaches are of limited value, since most such packaging structures are permeable to environmental moisture and ions to a measurable degree. This permeability, however slight, leaves the semiconductor chip susceptible to degradation from electrochemical reactions with atmospheric contaminants. The numerous and extensive polymer/metal interfaces at the lead entries of an encapsulated semiconductor package afford ample opportunities for moisture ingress as well as allowing soluble ions present to provide an electrolyte for a corrosive failure mechanism of the semiconductor chip. Also, the extensive use of precious metals coupled with base metals in chips and packages provide DC galvanic potentials for electrochemical corrosion reactions and dendrite growth, which affect the performance and life of the encapsulated semiconductor chip.

As a result of the problems associated with the plastic encapsulation of semiconductor chips, it has been established as desirable to hermetically package chips to prevent external moisture and chemicals from contacting the semiconductor chip. U.S. Pat. No. 5,136,364 issued Aug. 4, 1992 to Byrne relates to hermetically sealing semiconductor chip bond pads to prevent moisture contamination along the interface of the multiple metal layers of typical bond pads. The hermetic sealing comprises layers of passivation materials wherein the upper passivation layer is a silicon dioxide and nitride combination or silicon carbide. The hermetic sealing can also include layers of glass and/or polyimide.

It is known to seal semiconductor chip active surface circuitry at the wafer stage of production by applying a passivation coating to the wafer with ceramic materials such as silica and/or silicon nitride by chemical vapor deposition ("CVD") techniques. See, for example, U.S. Pat. Nos. 5,046,161, 5,084,752 and 5,406,122. However, the subsequent etching back of the passivation coating at the bond pads of the semiconductor chip may damage the passivation coating adjacent the bond pads, thereby affecting the reliability of the chip and shortening the life of the chip due to environmental corrosion. The sides of the passivation coating etched from the bond pad edges can also be permeable.

In an attempt to hermetically seal semiconductor chips without the use of external packages, U.S. Pat. No. 5,481,135 issued Jan. 2, 1996 to Chandra et al. suggests the use of lightweight ceramic protective coatings, such as those derived from hydrogen silsesquizane and silicate esters. These coatings are applied to the active surface of a semiconductor chip at a wafer level. Although the bond pads are subsequently exposed by removing a portion of the ceramic protective coating, the resultant circuits are purported to remain hermetically sealed. However, the process of this patent requires the application of a diffusion barrier metal layer to protect the bond pads during the etching to expose the bond pads.

A room temperature plasma deposition system capable of applying a low-stress silicon nitride over components on a circuit assembly is disclosed by L. Gates in "Sealed Chip-on-Board," Electronic Packaging & Production, September 1994, pp. 48–50 (the "Gates article"). In the described deposition process, a semiconductor die which is wire bonded to a substrate is subsequently entirely coated with silicon nitride. Thus, the silicon nitride covers the bond pads, bond wires, and other components of the assembly.

The disclosures of hermetically sealed semiconductor chips described above, with the exception of the Gates article, fail to provide a process for sealing a wafer or semiconductor chip without damage to the semiconductor chip or bond pads from back etching to expose the bond pads, unless additional processing steps are employed. Gates, moreover, does not address the complexities of hermetically sealing a flip chip type semiconductor die assembly. Therefore, it would be advantageous to develop a technique for simply, quickly and inexpensively forming a hermetic seal on in combination with commercially-available, widely-practiced semiconductor device fabrication techniques compatible with flip chip attachment.

SUMMARY OF THE INVENTION

The present invention relates to an apparatus and a method for providing a silicon nitride ($Si_3N_4$) hermetic seal over at least a portion of a flip chip prior to attachment to a substrate. The present invention also contemplates and includes sealing the flip chip and substrate with a silicon nitride layer after the attachment of the flip chip to the substrate. The present invention is achieved by providing a semiconductor chip having a plurality of bond pads on an active surface, wherein at least some of the bond pads carry a solder ball or other conductive material (hereinafter "conductive connector") disposed thereon (e.g., BGA or SLICC type arrangements).

A layer of silicon nitride, preferably a low temperature silicon nitride, is deposited on the active surface of the semiconductor chip to cover the exposed semiconductor die active surface and conductive connectors surmounting the bond pads thereon. The silicon nitride layer is preferably applied at a temperature of about ambient or room temperature to about 200° C., depending on the material of the printed circuit board or other carrier substrate to a thickness of about 1 to 2 $\mu$m by CVD. These parameters usually require 600 seconds or less to complete the deposition. Optionally, the silicon nitride layer can be applied by plasma enhanced CVD deposition or other deposition techniques known in the art. The room-temperature deposition process of the Gates article is suitable, particularly for FR-4 and other temperature-susceptible boards. The silicon nitride layer, without additional materials or processing, provides protection from moisture-driven ionic corrosion. The active surface of the semiconductor chip being sealed, it is thus protected from contamination and can be stored until needed in the semiconductor device fabrication process.

It is preferable to have the silicon nitride layer extend over the peripheral edges of the active surface of the semiconductor chip. By extending the silicon nitride layer over the semiconductor chip peripheral edges, the otherwise-exposed interfaces between the layers of circuitry carried on the semiconductor chip active surface and the interface between the circuitry and the underlying silicon (or other semiconductor substrate material, such as gallium arsenide) on which the circuitry is printed are hermetically sealed, this approach virtually eliminating the possibility of moisture or other contaminants infiltrating.

It is preferable to clean the semiconductor chip prior to coating with the silicon nitride layer. The semiconductor chip is preferably plasma cleaned with an oxygen (ozone) plasma system which removes organics and other contaminants from the surface of the semiconductor chip by pulling carbon into $CO_2$. As an alternative, solvent or other cleaning methods may be employed.

Before flip chip attachment to the carrier substrate, a portion of the silicon nitride layer covering each conductive connector is removed to expose a portion of the conductive connector material. The removal of the silicon nitride portion can be achieved through etching, such as by dipping the outer tips of the conductive connectors in an etch solution. A preferred etching solution is a phosphoric acid solution at a temperature of about 100° C. to about 140° C.

The removal of the silicon nitride portion at the tips or free ends of the conductive connectors can also be achieved through mechanical abrasion, optionally assisted by chemical reaction. A preferred abrasion technique is the use of a rotating polishing pad, as employed in a technique known in the industry as chemical mechanical polishing (planarizing) or "CMP" (see U.S. Pat. 5,449,314 issued Sep. 12, 1995 to Meikle et al.). CMP involves holding a semiconductor chip against a rotating wetted polishing platen under controlled chemical, pressure and temperature conditions. Typically, an aqueous colloidal silica solution is used as the abrasive fluid. The polishing or workpiece material removal mechanism is a combination of mechanical action and chemical reaction, the surface of the workpiece being polished with the aqueous solution. Employing the CMP technique in the present invention also provides the additional benefit of achieving a relatively precise and uniform connector height for all connectors extending from the active surface of the wafer being processed.

The removal of the silicon nitride portion can also be achieved by fracturing the silicon nitride at the conductive connector tips by transverse impact against a hard surface. To effect the required fracture, the silicon nitrided connector tip portions of a wafer are simply impacted against the surface ("spanked") with sufficient force to fracture the silicon nitride on the desired end portions of the conductive connectors. The spanking may either simply crack the silicon nitride, so that during solder reflow or epoxy cure, the conductive connector material penetrates the cracks to bond to the substrate terminal packs, or may completely break the silicon nitride off the end portions of the conductive connectors. The target impact surface may also be vibrated with ultrasonics for a more efficient "scrubbing" type removal of the silicon nitride portion during the spanking process.

As implied, it is, of course, understood that the above process steps can be, and desirably are, formed on a wafer level. The semiconductor chips may be diced immediately after the application of the silicon nitride layer or after the subsequent re-exposure of the conductive connector portion, although the latter approach is preferable. When a wafer is coated prior to dicing, it is preferable to scribe or etch a bevelled channel or trough around the boundary of each semiconductor die location on the wafer prior to coating. The bevel extends through the circuit layers on the active surface into the underlying substrate. Thus, when the silicon nitride layer is deposited over the wafer active surface, the layer extends into the bevels (channels) and partially covers what will be the semiconductor die active surface peripheral edges when the wafer is subsequently diced. With this technique, the interfaces between the layers of circuitry on the semiconductor die active surface and between the circuitry and the underlying silicon on which the circuitry is formed are sealed, virtually eliminating the possibility of contaminant infiltration.

A semiconductor device according to the invention is assembled by attaching the flip chip to a substrate having a plurality of terminal or connection pads on an active surface arrayed in a mirror image of the bond pads/conductive connectors of the silicon nitride coated semiconductor chip. The carrier substrate may comprise ceramic, silicon, polyimide or other polymers, FR-4, or similar materials, the particular substrate materials being insignificant to practice of the invention except as to temperature and time limitations affecting the nitriding process employed. Subsequent to flip chip attachment, the entire assembly is silicon nitrided, again preferably after plasma cleaning. It is noted that the silicon nitride CVD of the present invention is preferably performed at a temperature of about 50° C. to about 200° C., such process being well known in the art. While FR-4 (glass-epoxy laminate) board material has an upper temperature limit of about 175° C. before degradation is experienced, it has, however, been found by the inventors that the FR-4 material is sufficiently robust to withstand temperatures between 185° C. and 190° C. for short periods of time sufficient to achieve acceptable CVD of the silicon nitride. It is also noted that the use of a polyimide substrate material in combination with a silicon nitride coating as set forth in the present invention forms a hermetic seal with equivalent performance characteristics to a preformed ceramic package.

The nitrided flip chip is attached to the substrate by contacting the exposed conductive connector portions with their respective substrate bond pads. With the use of solder balls, the solder is reflowed to attach to the substrate terminal pads. With epoxy conductive elements, a heat cure is effected. The reflowed solder balls or cured epoxy elements are protected from corrosion by the silicon nitride layer without the need for an underfill encapsulant. Once the flip chip is attached to the substrate for further protection and sealing, a second passivation layer may be applied to the entire substrate/flip chip assembly. The second passivation layer is also preferably silicon nitride applied in the manner described above.

A secondary advantage of the use of silicon nitride is that the relatively small thickness required for it to effectively function as an encapsulant results in low stress in the film. Thus, the application of the silicon nitride layer will not cause warpage of the substrate that may occur in some instances with the use of other forms of semiconductor chip encapsulation, such as the previously mentioned "glob top," in combination with a carrier substrate of marginal structural rigidity.

It is, of course, understood that the semiconductor chip need not be coated (nitrided) prior to attachment to the substrate. The semiconductor chip can be first flip chip attached with the silicon nitride layer applied thereafter to the entire assembly.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE PREFERRED EMBODIMENT

Figure 1:
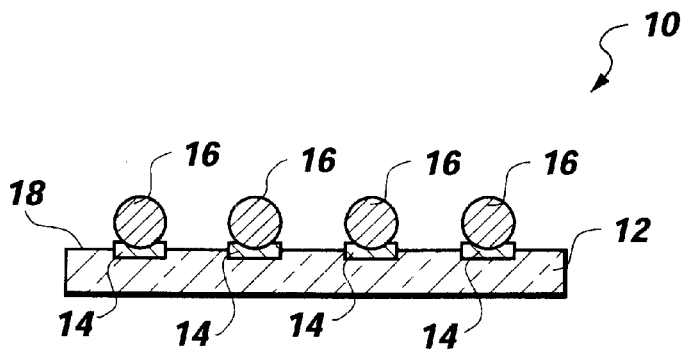
FIG. 1 is a side cross-sectional view of a flip chip.

FIG. 1 illustrates a conventionally configured flip chip 10 including a substrate 12 having a plurality of bond pads 14 disposed on its active surface 18. Each bond pad 14 has a conductive connector 16, such as a solder ball, conductive polymer or conductor-carrying polymer, disposed thereon.

Figure 2:
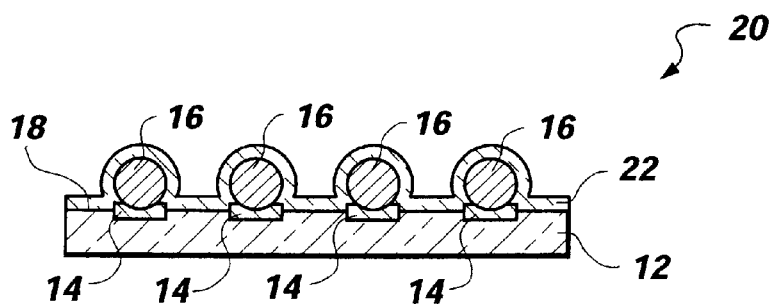
FIG. 2 is a side cross-sectional view of the flip chip of FIG. 1 having a silicon nitride coating on the active surface thereof.

FIG. 2 illustrates a silicon nitride-coated flip chip 20. Components common to FIG. 1 and FIG. 2 retain the same numeric designation. The coated flip chip 20 comprises the substrate 12 with bond pads 14 and conductive connectors 16. Any exposed portions of the active surface 18, conductive connectors 16 and bond pads 14 are covered by a layer of silicon nitride 22. The silicon nitride layer 22 is preferably applied at a temperature of about 50° C. to about 200° C. to a depth of about 1 to 2 $\mu$m by CVD and preferably plasma enhanced CVD, although sputtering evaporation or other know deposition methods are also suitable. However, the silicon nitride layer 22 may also be applied by other known deposition techniques, such as plasma deposition, as set forth in the Gates article.

It is important to note that $Si_3N_4$ or "silicon nitride" as referenced herein may contain impurities such as oxygen due to environmental conditions under which the deposition is effected. Therefore, silicon nitride coatings as employed in the invention are specifically contemplated to include such compounds, for example, $Si_3N_4$ containing up to ten percent (10%) oxygen impurities, termed silicon oxynitride (SiON).

Figure 3:
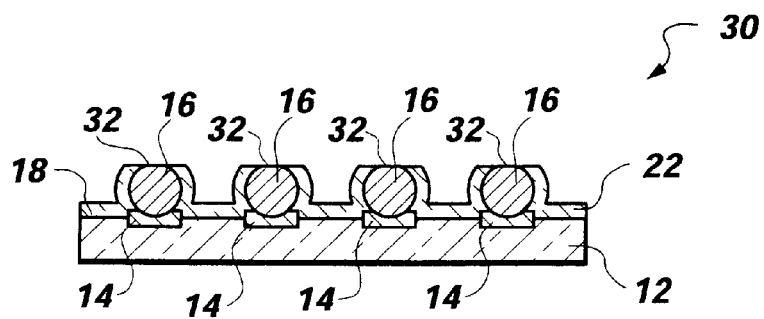
FIG. 3 is a side cross-sectional view of the silicon nitride coated flip chip of FIG. 2 with a portion of the silicon nitride coating removed to expose end portions of the conductive connectors.

FIG. 3 illustrates an exposed-connector flip chip 30. Components common to FIG. 2 and FIG. 3 retain the same numeric designation. The exposed-connector flip chip 30 comprises the coated flip chip 20 with a portion of the silicon nitride layer 22 adjacent the outer end of each conductive connector 16 having been removed or penetrated to expose an end portion 32 of each conductive connector 16. The removal of the silicon nitride portion can be achieved through etching the silicon nitride by dipping the tips of the conductive connectors 16 in an etch solution of phosphoric acid at about 100° C. to about 140° C. as previously noted. A straight hydrofluoric acid (HF) etch used at room temperature may also be used. Alternatively, dry plasma etches emloying a $C_2F_6$ plasma or an $NF_3$ plasma are suitable. Other alternatives include abrading away the silicon nitride on the tips of the conductive connectors 16 by mechanical abrasion alone (abrasive pad) or with a CMP apparatus and technique, by hitting the tips of the conductive connectors 16 perpendicularly against a preferably hard, target surface (with optional vibration of the surface), or by other suitable removal techniques as known in the art.

Figure 4:
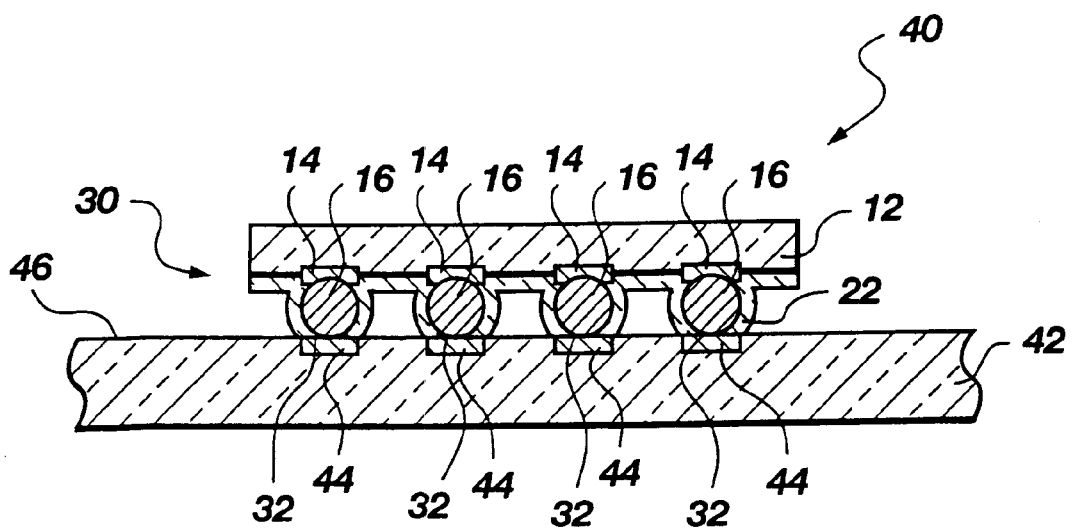
FIG. 4 is a side cross-sectional view of a semiconductor assembly including the exposed flip chip connectors of FIG. 3 attached to a substrate.

FIG. 4 illustrates a semiconductor device assembly 40. Components common to FIG. 3 and FIG. 4 retain the same numeric designation. The semiconductor device assembly 40 comprises the exposed-connector flip chip 30 attached to a carrier substrate 42. The substrate 42 includes a plurality of terminal pads 44 on the upper or carrier surface 46 of the substrate 42, pads 44 being in communication with conductive traces on or within substrate 42. The pattern of substrate terminal pads 44 is the mirror image of the pattern of conductive connectors 16 on the exposed-connector flip chip 30. The substrate 42 may be made of ceramic, silicon, polyimide or other polymers, FR-4, or similar materials, and may be rigid or flexible, due to the aforementioned low-stress characteristics of the silicon nitride coatings employed in the invention. The exposed-connector flip chip 30 is attached to the substrate 42 by contacting the exposed conductive connector end portions 32 with their respective terminal pads 44, and reflowing (if a solder or other C4-type connection) or curing (if an epoxy or other adhesive polymer connection).

Figure 5:
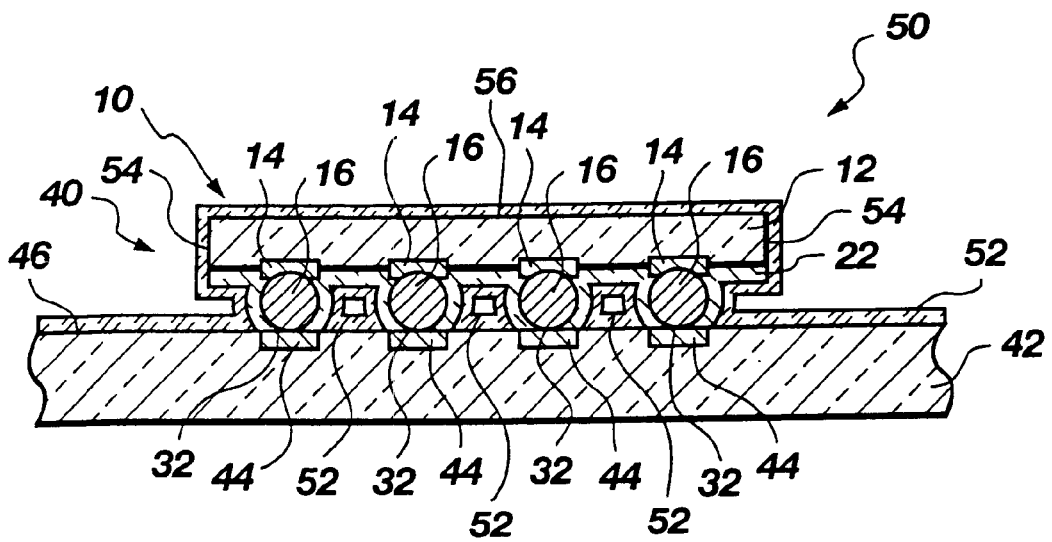
FIG. 5 is a side cross-sectional view of the first coated semiconductor assembly including the semiconductor assembly of FIG. 4 with a second silicon nitride coating subsequently applied.

FIG. 5 illustrates a first coated semiconductor assembly 50. Components common to FIG. 4 and FIG. 5 retain the same numeric designation. The coated semiconductor assembly 50 comprises the semiconductor device assembly 40 with the addition of a second passivation layer 52 applied to cover the previously uncoated surfaces of semiconductor device assembly 40, including at least the substrate carrier surface 46 as well as the sides 54 and back side 56 of flip chip 10. The second passivation or sealing layer 52 is preferably silicon nitride applied in the manner described above for coating the flip chip active surface 18.

Figure 6:
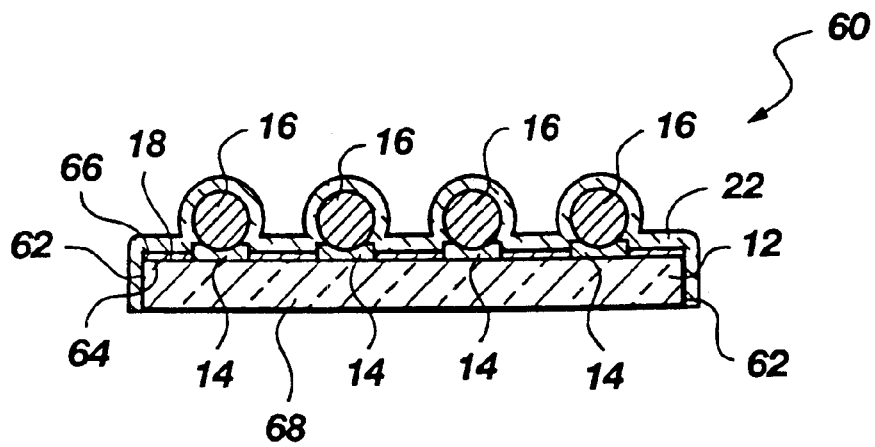
FIG. 6 is a side cross-sectional view of the flip chip of FIG. 1 having a silicon nitride coating which extends over the peripheral edges thereof.

FIG. 6 illustrates another coated flip chip 60. The coated flip chip of FIG. 6 is similar to the coated flip chip 20 of FIG. 2; therefore, components common to FIG. 2 and FIG. 6 retain the same numeric designation. The coated flip chip 60 differs from the coated flip chip 20 of FIG. 2 in that the silicon nitride layer 22 extends over the peripheral edges 62 of the flip chip 20. By extending the silicon nitride layer 22 over the flip chip peripheral edges 62, interfaces 64 between circuitry layers 66 on the flip chip active surface 18 and the underlying silicon 68 on which the circuitry layers 66 are formed are sealed. As shown in FIG. 6, the silicon nitride layer 22 extends over the entire side surface of chip 60. Such a layer would be applied after singulation of chip 60 from the wafer on which it is formed. This is made possible by stretching the elastic film supporting the wafer on the wafer frame to physically separate the chips or dice sufficiently for side-coating of the individual components.

Figure 7:
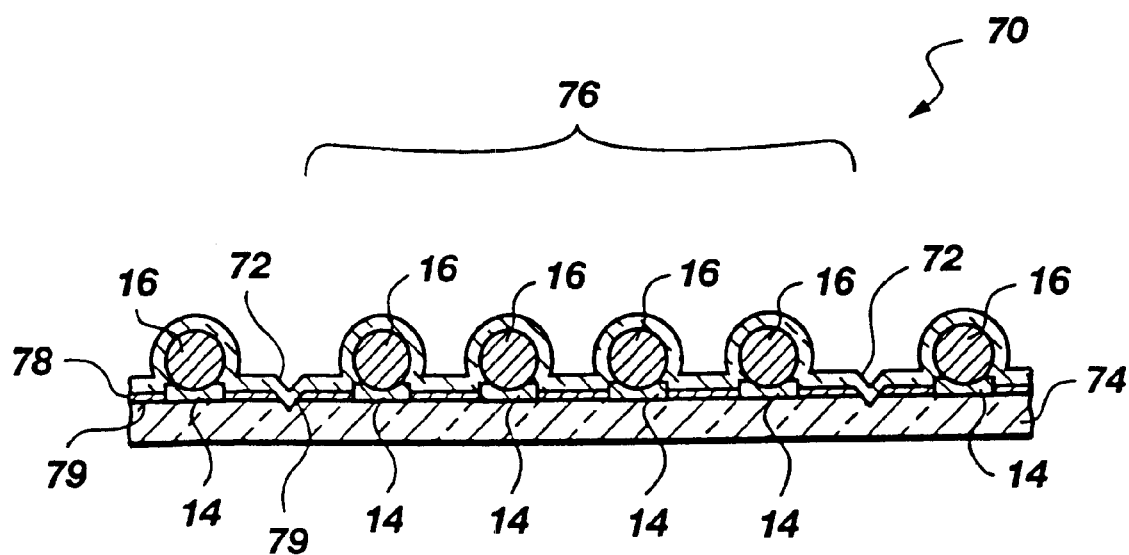
FIG. 7 is a side cross-sectional view of a silicon nitride coated, prescribed wafer.

FIG. 7 illustrates a wafer 70. The wafer 70 of FIG. 7 is similar to the coated flip chip 20 of FIG. 2, chip 20 having been singulated from such a wafer 70; therefore, components common to FIG. 2 and FIG. 7 retain the same numeric designation. The wafer 70 has an etched or scribed, bevelled channel or trough 72 extending into the wafer substrate 74 defining each discrete semiconductor die portion 76 and on the wafer 70 prior to coating with silicon nitride. The troughs 72 preferably extend through all circuit layers into the semiconductive material of wafer substrate 74. When a silicon nitride layer 78 is deposited on the wafer 70, the layer 78 conformably extends into the troughs 72. Thus, the silicon nitride layer 78 at least partially covers what will be the flip chip periphery edges of the active devices and circuitry when the wafer 70 is diced, and completely covers the circuitry layers at their exposed edges as well as the circuitry/wafer material interface. As a result, the interfaces 79 between the circuitry layers and between lowermost layer and the wafer substrate 74 on which the circuitry layers are formed are sealed.

Figure 8:
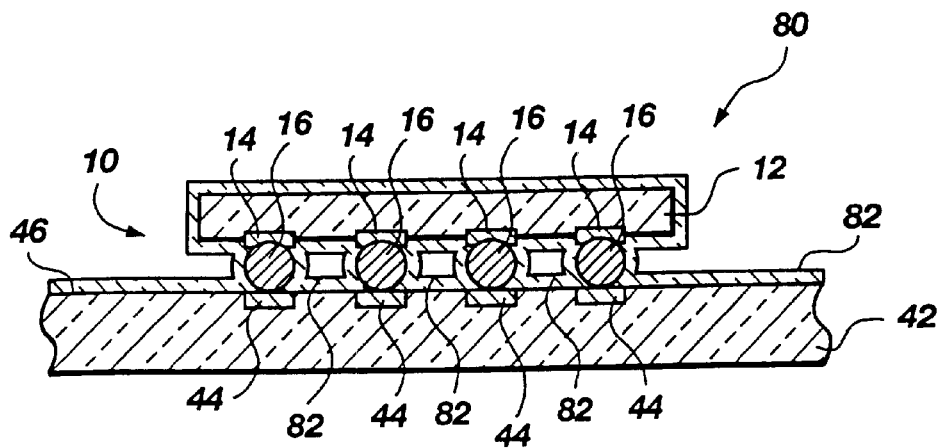
FIG. 8 is a side cross-sectional view of a second coated semiconductor assembly wherein a single silicon nitride coating is applied after flip chip attachment.

FIG. 8 illustrates a second coated semiconductor assembly 80. The second coated semiconductor assembly 80 is similar to the first coated semiconductor assembly 50 of FIG. 5; therefore, components common to FIG. 5 and FIG. 8 retain the same numeric designation. The second coated semiconductor assembly 80 comprises the conventional flip chip 10 (as shown in FIG. 1) attached to the substrate 42. A silicon nitride layer 82 is applied after flip chip attachment to cover the flip chip 10 and the substrate carrier surface 46. Any exposed portions of the flip chip 10, including the conductive connectors 16, such as solder or other conductive balls or elements, and bond pads 14, and the substrate carrier surface, including any exposed portions of the substrate terminal pads 44, are covered by a single layer of silicon nitride 82. Therefore, one layer of silicon nitride eliminates the need for both an underfill and an outer encapsulant.

Figure 9:
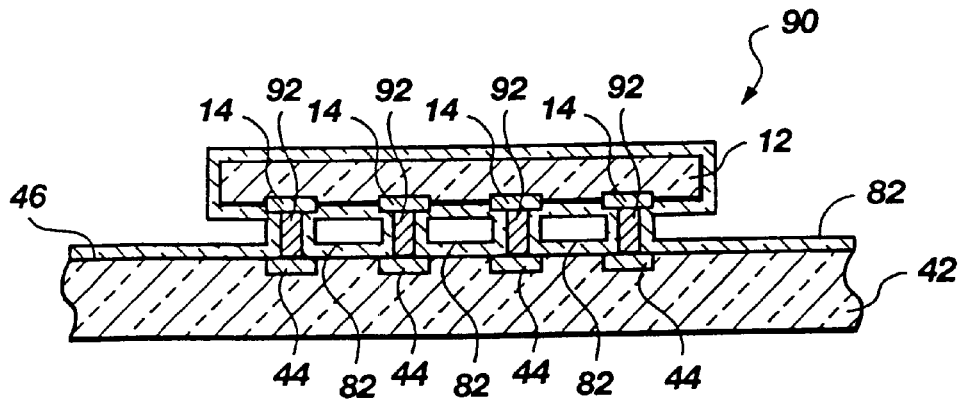
FIG. 9 is a side cross-sectional view of a third coated semiconductor assembly.

FIG. 9 illustrates a third coated semiconductor assembly 90. The third coated semiconductor assembly 90 is similar to the second coated semiconductor assembly 80 of FIG. 8; therefore, components common to FIG. 8 and FIG. 9 retain the same numeric designation. The third coated semiconductor assembly 90 differs from the second coated semiconductor assembly 80 of FIG. 8 in that the conductive connectors 16 (illustrated in FIG. 8 as solder balls or other reflowable or curable conductive connectors) are replaced by pins or other rigid elements 92. It will be appreciated by those of ordinary skill in the art, particularly from the illustration of FIG. 9, that the type of chip-to-substrate connection employed with the method of the invention may be as desired by the user, and is not limited to reflowable metallic or curable conductive adhesive polymeric elements applied to the chip. That is to say, pins, non-reflowable balls or other rigid mechanical connectors may be employed with appropriate adherent or other securing mechanisms to effect the electrical and mechanical chip-to-substrate connections followed by silicon nitriding.

Figure 10:
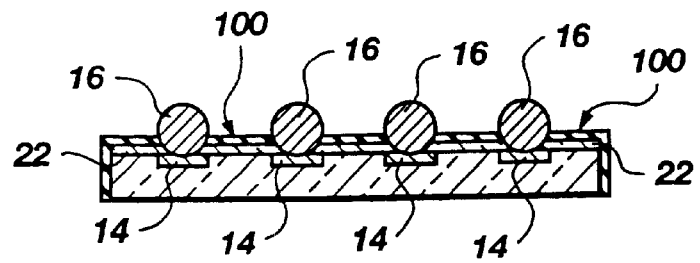
FIG. 10 is a side cross-sectional view similar to FIG. 3, but with the conductive connectors substantially exposed.

FIG. 10 depicts an exposed-connector flip chip 30 similar to that shown in FIG. 3 but with substantially exposed conductive connectors 16. Such exposure may be achieved by etching the silicon nitride layer 22 around connectors 16 while protecting the portion of layer 22 covering active surface 18 and surrounding connectors 16 with a protective layer 100. Protective layer 100 may comprise a positive or negative photoresist, as known in the art, or a screened-on or printed-on etchant-resistive material, as known in the art. As shown, protective layer 100 may desirably extend down the sides of flip chip 30 whether or not silicon nitride layer 22 so extends. Protective layer 100 may be removed from flip chip 30, as desired, or may remain thereon. Of course, if a subsequent nitride layer is to be applied after connection of flip chip 30 to a carrier substrate, it is desirable to remove protective layer 100 to ensure mutual adhesion of the two silicon nitride layers.

Having thus described in detail preferred embodiments of the present invention, it is to be understood that the invention defined by the appended claims is not to be limited by particular details set forth in the above description as many apparent variations thereof are possible without departing from the spirit or scope thereof.

What is claimed is:

1. A semiconductor device assembly, comprising:
   a chip having an active surface including a plurality of discrete, mutually laterally spaced conductive connectors extending transversely outwardly therefrom;
   a carrier substrate having a surface facing said active surface, said facing surface having terminal pads thereon in electrical contact with outer ends of said discrete conductive connectors; and
   a layer of silicon nitride disposed over said active surface and about each of said discrete conductive connectors, portions of said layer of silicon nitride laterally enveloping each of said discrete conductive connectors and extending substantially at least to said terminal pads of said carrier substrate.

2. The semiconductor device assembly of claim 1, wherein said silicon nitride layer extends over peripheral edges of said chip bounding said active surface.

3. The semiconductor device assembly of claim 1, further including a passivation layer extending over substantially all exterior surfaces of said chip and at least said facing carrier substrate surface.

4. The semiconductor device assembly of claim 2, wherein said passivation layer includes a second silicon nitride layer.

5. The semiconductor device assembly of claim 1, wherein said discrete conductive connectors are selected from the group comprising reflowable metallic materials, conductive polymers and conductor-carrying polymers.

6. The semiconductor device assembly of claim 1, wherein said discrete conductive connectors comprise substantially rigid elements.

7. The semiconductor device assembly of claim 1, wherein said silicon nitride layer is about 1 to 2 $\mu$m thick.

8. A semiconductor device assembly, comprising:
   a chip having an active surface including a plurality of discrete, mutually laterally spaced conductive connectors extending transversely outwardly therefrom;
   a carrier substrate including terminal pads on a surface thereof facing said active surface, said terminal pads being in electrical contact with said discrete conductive connectors; and
   at least one layer of silicon nitride disposed at least over said substrate surface, said active surface and completely laterally enveloping exterior portions of said discrete conductive connectors extending from said chip at least to said terminal pads of said carrier substrate.

9. The semiconductor device assembly of claim 8, wherein said discrete conductive connectors are selected from the group comprising reflowable metallic elements, conductive polymers and conductor-carrying polymers.

10. The semiconductor assembly of claim 8, wherein said discrete conductive connectors comprise substantially rigid elements.

11. The semiconductor device assembly of claim 8, wherein said silicon nitride layer is about 1 to 2 $\mu$m thick.

12. A semiconductor device assembly, comprising:
    a chip having an active surface including a plurality of discrete, mutually laterally spaced conductive connectors extending transversely outwardly therefrom;
    a carrier substrate having a surface facing said active surface, said facing surface having terminal pads thereon in electrical contact with outer ends of said discrete conductive connectors; and
    a layer of silicon nitride disposed over said active surface and about each of said discrete conductive connectors, portions of said layer of silicon nitride laterally enveloping each of said discrete conductive connectors and extending substantially at least to said terminal pads of said carrier substrate, said silicon nitride layer extending over peripheral edges of said chip bounding said active surface.

13. The semiconductor device assembly of claim 12, further including a passivation layer extending over substantially all exterior surfaces of said chip and at least said facing carrier substrate surface.

14. The semiconductor device assembly of claim 13, wherein said passivation layer includes a second silicon nitride layer.

15. The semiconductor device assembly of claim 12, wherein said discrete conductive connectors are selected from the group comprising reflowable metallic materials, conductive polymers and conductive-carrying polymers.

16. The semiconductor device assembly of claim 12, wherein said discrete conductive connectors comprise substantially rigid elements.

17. The semiconductor device assembly of claim 12, wherein said silicon nitride layer is about 1 to 2 $\mu$m thick.

18. A semiconductor device assembly, comprising:
    a chip having an active surface including a plurality of discrete, mutually laterally spaced conductive connectors extending transversely outwardly therefrom;
    a carrier substrate having a surface facing said active surface, said facing surface having terminal pads thereon in electrical contact with outer ends of said discrete conductive connectors;
    a layer of silicon nitride disposed over said active surface and about each of said discrete conductive connectors, portions of said layer of silicon nitride laterally enveloping each of said discrete conductive connectors and extending from said chip at least to said terminal pads of said carrier substrate; and
    a passivation layer extending over substantially all exterior surfaces of said chip and at least said facing carrier substrate surface.

19. The semiconductor device assembly of claim 18, wherein said silicon nitride layer extends over peripheral edges of said chip bounding said active surface.

20. The semiconductor device assembly of claim 18, wherein said passivation layer includes a second silicon nitride layer.

21. The semiconductor device assembly of claim 18, wherein said discrete conductive connectors are selected from the group comprising reflowable metallic materials, conductive polymers and conductor-carrying polymers.

22. The semiconductor device assembly of claim 18, wherein said discrete conductive connectors comprise substantially rigid elements.

23. The semiconductor device assembly of claim 18, wherein said silicon nitride layer is about 1 to 2 $\mu$m thick.

24. An intermediate semiconductor device product, comprising:

a semiconductor wafer substrate;

a plurality of semiconductor die on said substrate, each semiconductor die of said plurality of semiconductor die having an active surface including a plurality of discrete, mutually laterally spaced conductive connectors extending transversely outwardly therefrom;

beveled channels defining peripheral edges of each semiconductor die of said plurality of semiconductor die; and a layer of silicon nitride disposed over said substrate and active surface and about each of said discrete conductive connectors substantially enveloping each of said discrete conductive connectors and extending into the beveled channels at least partially covering said peripheral edges of each said semiconductor die.

25. The intermediate semiconductor device product of claim 24, wherein said beveled channels extend completely through the semiconductor wafer substrate.

26. The intermediate semiconductor device product of claim 24, wherein said discrete conductive connectors are selected from the group comprising reflowable metallic materials, conductive polymers and conductor-carrying polymers.

27. The intermediate semiconductor device product of claim 24, wherein said discrete conductive connectors comprise substantially rigid elements.

28. The intermediate semiconductor device product of claim 24, wherein said silicon nitride layer is about 1 to 2 $\mu$m thick.

* * * * *

UNITED STATES PATENT AND TRADEMARK OFFICE
CERTIFICATE OF CORRECTION

PATENT NO. : 6,528,894 B1  
APPLICATION NO. : 09/138038  
DATED : March 4, 2003  
INVENTOR(S) : Salman Akram and Warren Farnworth It is certified that error appears in the above-identified patent and that said Letters Patent is hereby corrected as shown below:

On The Title Page, Item (57)
LINE 2, change "is disclosed" to --are disclosed--

In the drawings:
In FIG. 10 add reference elements 18 and 30 and associated lead lines.

| | | |
|---|---|---|
| COLUMN 1, | LINE 18, | change "dice" to --die-- |
| COLUMN 2, | LINE 54, | change "hydrogen silsesquizane" to --hydrogen silsesquioxane-- |
| COLUMN 3, | LINE 51, | before "is thus" delete "it" |
| COLUMN 3, | LINE 62, | change "sealed, this" to --sealed. This-- |
| COLUMN 3, | LINE 63, | change "eliminating" to --eliminates-- |
| COLUMN 4, | LINE 53, | change "bevelled" to --beveled-- |
| COLUMN 5, | LINE 5, | change "materials," to --materials;-- |
| COLUMN 6, | LINE 40, | change "know" to --known-- |
| COLUMN 6, | LINE 44, | insert a comma --,-- after "$Si_3N_4$" |
| COLUMN 6, | LINE 45, | insert a comma --,-- after "herein" |
| COLUMN 6, | LINE 65, | change "emloying" to --employing-- |
| COLUMN 7, | LINE 10, | change "substrate 42" to --carrier substrate 42-- |
| COLUMN 7, | LINE 11, | change "carrier surface 46" to --substrate carrier surface 46-- |
| COLUMN 7, | LINE 12, | change "substrate 42" to --carrier substrate 42-- and change "pads 44" to --terminal pads 44-- |
| COLUMN 7, | LINE 13, | change "substrate 42." to --carrier substrate 42.-- |
| COLUMN 7, | LINE 16, | change "substrate 42" to --carrier substrate 42-- |
| COLUMN 7, | LINE 21, | change "substrate 42" to --carrier substrate 42-- |
| COLUMN 7, | LINE 28, | after "The" and before "coated" insert --first-- |
| COLUMN 7, | LINE 43, | change "flip chip 20." to --coated flip chip 20.-- |
| COLUMN 7, | LINE 48, | change "chip 60." to --coated flip chip 60.-- |
| COLUMN 7, | LINE 49, | change "chip 60" to --coated flip chip 60-- |
| COLUMN 7, | LINE 55, | change "chip 20" to --coated flip chip 20-- |
| COLUMN 7, | LINE 58, | change "bevelled" to --beveled-- |
| COLUMN 7, | LINE 64, | before the second occurrence of "layer" (at the end of the line) insert --silicon nitride-- |
| COLUMN 8, | LINE 13, | change "substrate 42." to --carrier substrate 42.-- |
| COLUMN 8, | LINE 21, | after "a single" delete "layer of" |

UNITED STATES PATENT AND TRADEMARK OFFICE
CERTIFICATE OF CORRECTION

PATENT NO. : 6,528,894 B1
APPLICATION NO. : 09/138038
DATED : March 4, 2003
INVENTOR(S) : Salman Akram and Warren Farnworth It is certified that error appears in the above-identified patent and that said Letters Patent is hereby corrected as shown below:

|  | COLUMN 8, | LINE 22, | change "nitride 82." to --nitride layer 82.-- |
|---|---|---|---|
|  | COLUMN 8, | LINE 47, | change "connectors 16" to --conductive connectors 16-- |
|  | COLUMN 8, | LINE 48, | change "layer 22" to --silicon nitride layer 22-- |
|  | COLUMN 8, | LINE 49, | change "connectors 16" to --conductive connectors 16-- |
|  | COLUMN 8, | LINE 54, | change "flip chip 30" to --exposed-connected flip chip 30-- |
|  | COLUMN 8, | LINES 55, 56, | change "flip chip 30," to --exposed-connector flip chip 30,-- |
|  | COLUMN 8, | LINE 58, | change "flip chip 30" to --exposed-connector flip chip 30-- |
| CLAIM 4, | COLUMN 9, | LINE 25, | change "claim 2," to --claim 3,-- |

Signed and Sealed this

Twenty-second Day of January, 2008

JON W. DUDAS
*Director of the United States Patent and Trademark Office*

UNITED STATES PATENT AND TRADEMARK OFFICE
CERTIFICATE OF CORRECTION

PATENT NO. : 6,528,894 B1
APPLICATION NO. : 09/138038
DATED : March 4, 2003
INVENTOR(S) : Salman Akram and Warren Farnworth It is certified that error appears in the above-identified patent and that said Letters Patent is hereby corrected as shown below:

Please replace FIG. 10 with the following:

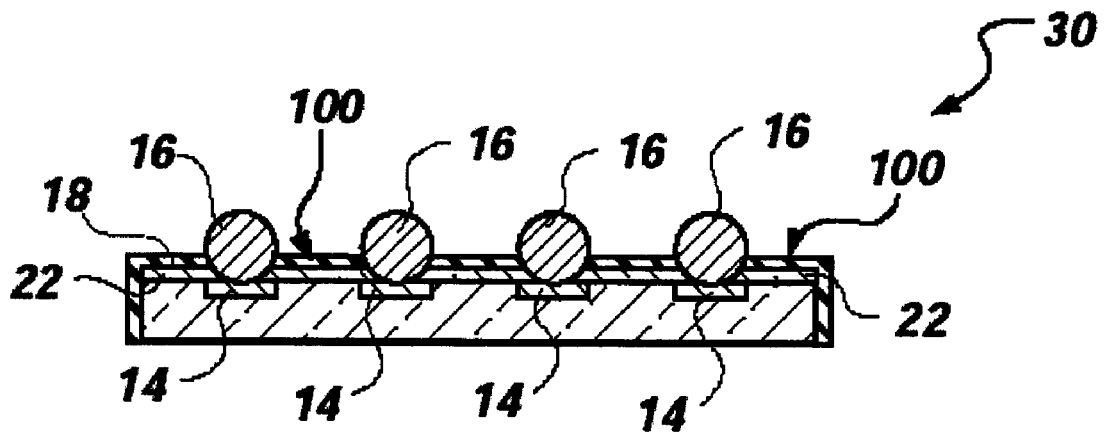

Fig. 10